Figure 1:
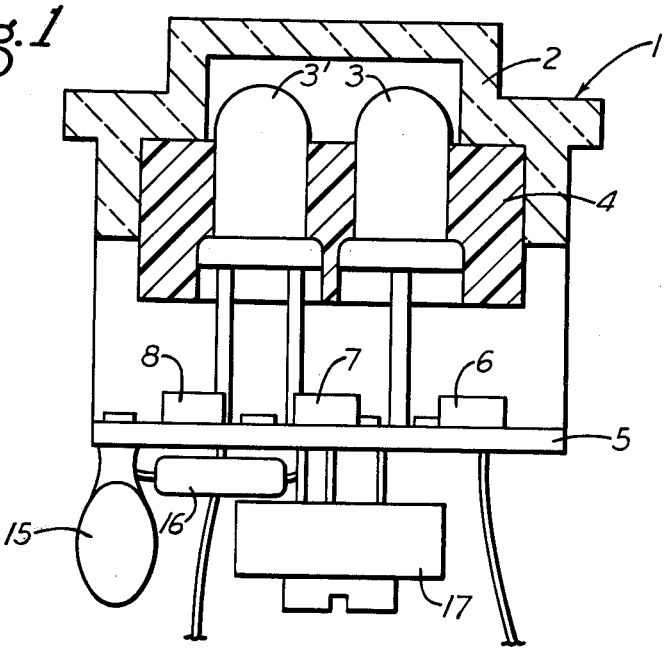

United States Patent [19]

Höht et al.

[11] 4,196,428
[45] Apr. 1, 1980

[54] DEVICE FOR MONITORING OPERATIONAL READINESS OF A GAS-MEASURING INSTRUMENT

[75] Inventors: Wolfgang Höht; Ingo Reichert; Joachim Weidinger, all of Berlin, Fed. Rep. of Germany

[73] Assignee: Auergesellschaft GmbH, Berlin, Fed. Rep. of Germany

[21] Appl. No.: 878,421

[22] Filed: Feb. 16, 1978

[30] Foreign Application Priority Data

Feb. 22, 1977 [DE]  Fed. Rep. of Germany ....... 2707569

[51] Int. Cl.[2] .......................................... G08B 29/00
[52] U.S. Cl. ..................................... 340/636; 320/48; 324/435
[58] Field of Search .............. 340/636, 663; 324/29.5; 320/48

[56] References Cited

U.S. PATENT DOCUMENTS

| | | | |
|---|---|---|---|
| 3,921,064 | 11/1975 | Mori et al. | 340/636 |
| 3,927,399 | 12/1975 | Fuzzell | 340/636 |
| 3,930,198 | 12/1975 | Williamson, Jr. | 340/636 |
| 4,030,086 | 6/1977 | Salem | 340/636 |

*Primary Examiner*—Alvin H. Waring
*Attorney, Agent, or Firm*—Brown, Flick & Peckham

[57] ABSTRACT

A device for monitoring and indicating the operational readiness of a gas-measuring instrument fitted with a built-in chargeable battery has visible luminescent diodes that emit different colors when energized and which are disposed in an electrical flip-flop circuit with rheostats for adjusting the switchover values of the circuit which is provided with a pair of input leads for connecting a chargeable battery to the circuit.

6 Claims, 2 Drawing Figures

DEVICE FOR MONITORING OPERATIONAL READINESS OF A GAS-MEASURING INSTRUMENT

This invention relates to a device for monitoring and indicating the operational readiness of a gas-measuring apparatus or instrument which is operated by a built-in chargeable battery.

With gas measuring and warning instruments that are operated by means of built-in chargeable batteries, which are thus independent of the power network and which are used as warning devices; for example, underground in an atmosphere where there is the danger of a possible explosion, it is necessary in order to ensure an accurate measurement and, if need be, the emitting of an alarm during operation, to know whether a given instrument is operated satisfactorily by its power supply; i.e. its battery. Thus, an instrument of this type must be equipped with an indicating device in order to monitor the battery. This can be especially important with the chargeable batteries employed, because the voltage reduction, which should be indicative of the discharge, takes place suddenly and a critical situation may arise within minutes when the instrument may no longer be capable of being used. It is therefore essential with this type of equipment to provide a device that indicates the equipment's operational readiness; that is, which indicates the battery's state of charge.

Thus, for example, for this purpose voltage measuring devices have been installed in the form of a visual signal with a rotating coil or rotating magnet system. Because the battery voltage reduction is very small while the apparatus is being operated and then takes place suddenly during the discharging phase, it has been found advantageous to employ a certain indication or scale characteristic to make relatively small variations in the measuring values recognizable. This is generally accomplished by a considerable suppression of the zero, a crowding of the indication at the scale-end and an expansion in the main indicating region and thus at the center of the scale, so that the reading and estimation of the state of charge is possible by means of a relatively reliable reading. It has been found, however, that such an indication is inadequate. Apart from a certain sensitivity of the measuring device to percussion and shock, it has been found that the indication can be disturbed by stray fields due to inadequate magnetic shielding, especially in the case of rotating magnet instruments, so that even with instruments with expanded scales a small change in the battery voltage cannot be satisfactorily and promptly perceived due, for example, to subjective reading errors. In darkness or poor illumination, the indication given by these devices is no longer sufficiently readable.

Because the measurement of the terminal voltage with the aid of a visible signal clearly cannot give a sufficiently accurate indication concerning the loading battery's state of charge, it was proposed in accordance with German Patent Specification No. 1,598,519 to incorporate a step-by-step counter that advances with each actuation of the instrument key. It should thus be possible to judge the condition of the battery from the number of measurements counted by the counter and the setting indicated by the visual signal. However, an arrangement of this type cannot give a true measure of the state of charge of a battery that is undergoing a rapid drop in voltage during the discharge because, with an old battery or a charged battery that has been left standing for a long time, the number of possible measurements is certainly less than with a new battery. Consequently, the counter does not provide adequate information concerning the battery's true state.

It is among the objects of this invention to provide for indicating a battery's state of charge by means of a device which is small, which has a low power consumption, which has an adjustable and reproducible indication range, and which is much less sensitive than other measuring devices of this type to mechanical influences and to stray electrical and magnetic fields.

These objectives are attained in accordance with this invention by means of a luminescent diode arrangement encased in a plastic housing provided with a transparent viewing cover. The luminescent diodes, which emit different colors, are connected in an electric sweep (flip-flop) circuit, the switchover values of which are set by rheostats.

It is additionally advantageous for the device to be made as a unit in an integrated circuit. By additionally wiring the luminescent diodes outside the unit, or by the use of luminescent diodes with built-in circuitry, it is possible to light up the diodes abruptly with very little change in voltage. In particular, the response threshold of the system is set by a Zener diode in the input of the circuit in the base of the input transistor of the device. A wider range of temperature, independent of the response threshold, is achieved by employing a temperature-dependent resistance in the base-emitter circuit of the input transistor.

The advantages obtained by means of this invention reside, in particular, in the fact that the indication threshold of the device can be easily and accurately set to suit the batteries employed, so that indication of a suddenly falling voltage is effected promptly and can also be seen in the critical situation when the lighting is bad. It also is possible, by suitable adjustments, to carry out a number of measurements with the device even after the diodes have been extinguished.

A form of construction in accordance with the invention and which is given by way of example is illustrated in the accompanying drawings and will be described in greater detail herein.

Figure 2:
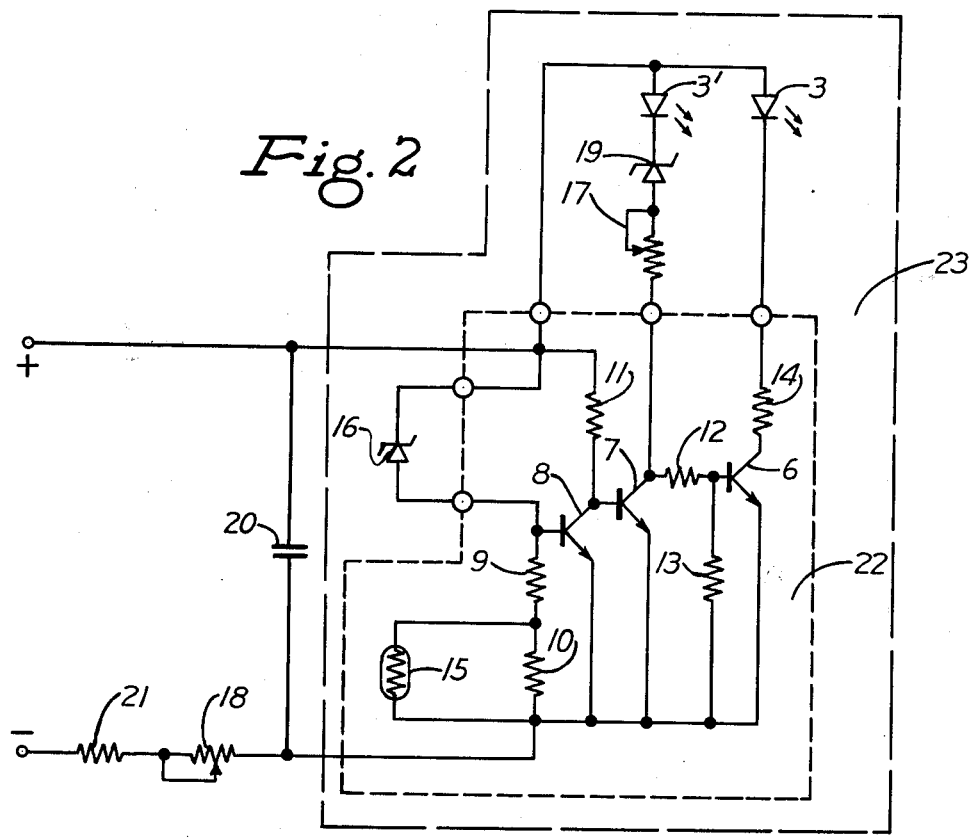

FIG. 1 is a cross section of the device, and
FIG. 2 is a circuit diagram of the device.

Referring to the drawings, the device 1 is provided with a transparent cap 2, beneath which luminescent diodes 3 and 3' are mounted in a darkly colored holder 4 that is made of an insulating material. The two diodes emit different colors. Transistors 6 and 7 and input transistor 8 with their resistors 9, 10, 11, 12, 13 and 14 are arranged on a printed circuit board 5 and are electrically connected with the luminescent diodes. Additionally mounted on the circuit board are a temperature-dependent resistor (thermistor) 15, Zener diode 16 and rheostat 17. A rheostat 18 and a condenser 20 are mounted on another printed circuit board, not shown.

The arrangement disclosed will permit precise adjustable battery monitoring. The voltage of the battery of the gas measuring and warning instrument is applied to the +, − terminals of the device. The response voltage of the device is set by means of rheostat 18 in one of the lines from the battery. Extensive freedom from feedback in the device is effected by means of condenser 20 connected across both lines from the battery. The condenser is of such size that an adequate response-delay is attained. Along with rheostat 17, transistors 6 and 7 are arranged with resistors 12, 13, 14 and luminescent diodes 3 and 3' in a flip-flop circuit.

Abrupt switch-off of luminescent diode 3' is achieved by the incorporation of a Zener diode 19 in the circuit of diode 3', between it and rheostat 17.

Transistor 8, along with resistors 9, 10 and 11, is provided to ensure feed-back-free coupling to the voltage to be monitored. The Zener diode 16 determines the response voltage of the device. This response voltage is set with the aid of rheostat 18. Thermistor 15, in parallel with resistor 10, makes it possible to compensate for the temperature coefficient of Zener diode 16 and thus maintain the response voltage of the device constant over a wide temperature range. The switch-off threshold of luminescent diode 3' can be adjusted by means of rheostat 17. Luminescent diode 3 lights up at full battery voltage. When that voltage drops below a certain specified value, this luminescent diode extinguishes and luminescent diode 3' lights up. This switch-over threshold of diode 3 can be set up by means of rheostat 18, independent of the response threshold. With the aid of a resistor 21, which can be variable if need be and which is in series with rheostat 18, the device can be matched to a correspondingly high voltage. In addition, the working range of the circuit can be set by the choice of a suitable Zener diode 16.

It is advantageous to enclose as a unit the components lying within the area 22 surrounded by the inner broken lines in FIG. 2, by thick-film technology, for example, or combined as an integrated circuit. They are shown mounted on circuit board 5, as also are the five components outside area 22 but surrounded by the outer broken lines 23.

According to the provisions of the patent statutes, we have explained the principle of our invention and have illustrated and described what we now consider to represent its best embodiment. However, we desire to have it understood that, within the scope of the appended claims, the invention may be practiced otherwise than as specifically illustrated and described.

We claim:

1. A device for monitoring and indicating the operational readiness of a gas-measuring instrument fitted with a built-in chargeable battery, the device comprising a housing provided with a transparent wall area, luminescent diodes disposed in said housing and visible through said wall area, said diodes emitting different colors when energized, an electrical flip-flop circuit containing said diodes for respective energization thereof in different switching states of said flip-flop circuit, rheostat means for adjusting the switch-over values of said circuit, and a pair of input leads for connecting a chargeable battery to the circuit, said circuit including a rheostat connected with one of the luminescent diodes for adjusting the switch-off threshold of said one diode, and a Zener diode located in the circuit of said one diode to determine the switch-on range of said one diode.

2. A device according to claim 1, wherein the device is constructed as a unit in an integrated circuit.

3. A device according to claim 1, in which said circuit includes an input transistor and a Zener diode connected with the base of said transistor for setting the response threshold of the device.

4. A device according to claim 1, in which said circuit includes an input transistor, a pair of resistors connected in series between the base and emitter of said transistor, and a temperature-dependent resistor shunted across one of said resistors.

5. A device according to claim 1, including a rheostat in one of said input leads, and a condenser connected across said leads.

6. A device according to claim 1, including a rheostat in one of said input leads, a resistor in one of said input leads, and a condenser connected across said leads, said rheostat and resistor and condenser being located outside of said housing.

* * * * *